United States Patent
Bondor et al.

(10) Patent No.: US 10,482,003 B1
(45) Date of Patent: Nov. 19, 2019

(54) METHOD AND SYSTEM FOR MODIFYING A CONTROL UNIT OF AN AUTONOMOUS CAR

(71) Applicant: AImotive Kft., Budapest (HU)

(72) Inventors: András Bondor, Martonvásár (HU); László Kishonti, Budapest (HU)

(73) Assignee: AImotive Kft., Budapest (HU)

(*) Notice: Subject to any disclaimer, the term of this patent is extended or adjusted under 35 U.S.C. 154(b) by 0 days.

(21) Appl. No.: 16/185,088

(22) Filed: Nov. 9, 2018

(51) Int. Cl.
*G06F 11/36* (2006.01)
*G06F 17/50* (2006.01)
*G05D 1/00* (2006.01)
*G06K 9/00* (2006.01)

(52) U.S. Cl.
CPC ....... *G06F 11/3684* (2013.01); *G05D 1/0088* (2013.01); *G06F 17/5095* (2013.01); *G05D 2201/0213* (2013.01); *G06K 9/00791* (2013.01)

(58) Field of Classification Search
CPC ............ G06F 11/3684; G06F 17/5095; G05D 1/0088; G05D 2201/0213; G06K 9/00791
See application file for complete search history.

(56) References Cited

U.S. PATENT DOCUMENTS

| | | | |
|---|---|---|---|
| 9,286,525 B2 * | 3/2016 | Nentwig | G06K 9/00805 |
| 10,222,229 B1 * | 3/2019 | Shum | G06F 8/65 |
| 2016/0210383 A1 | 7/2016 | Alaniz et al. | |
| 2017/0132117 A1 | 5/2017 | Stefan et al. | |
| 2017/0132118 A1 | 5/2017 | Stefan et al. | |
| 2017/0161414 A1 | 6/2017 | Kible et al. | |
| 2019/0049968 A1 * | 2/2019 | Dean | G05D 1/0088 |

FOREIGN PATENT DOCUMENTS

| | | |
|---|---|---|
| DE | 102007053500 A1 | 12/2008 |
| DE | 102007053501 A1 | 1/2009 |
| DE | 102008027526 A1 | 12/2009 |

(Continued)

OTHER PUBLICATIONS

Stellet, J., et al. "Testing of Advanced Driver Assistance Towards Automated Driving: A Survey and Taxonomy on Existing Approaches and Open Questions" IEEE 18th Int'l Conf. on Intelligent Transportation Systems, pp. 1455-1462 (2015) available from (Year: 2015).*

(Continued)

*Primary Examiner* — Jay Hann
(74) *Attorney, Agent, or Firm* — Wood Herron & Evans LLP (57) ABSTRACT

Sensor data is recorded during testing of a control unit of an autonomous car in an autonomous driving mode. In response to being triggered by a disengagement event, recorded sensor data from an analysis time window prior to the disengagement event is logged. The logged sensor data is processed in a simulator using the control unit to control a virtual autonomous car to identify the inadequately operating component of the control unit. The component may be modified and retested until the disengagement event is avoided in the simulator. The control unit with the modified component may then be used to record new sensor data during testing of the control unit in the autonomous driving mode, and the simulation repeated on the new data.

9 Claims, 4 Drawing Sheets

(56) References Cited

FOREIGN PATENT DOCUMENTS

DE    102011088805 A1    6/2013

OTHER PUBLICATIONS

Huang, W., et al. "Autonomous Vehicles Testing Methods Review" IEEE 19th Int'l Conf. on Intelligent Transportation Systems, pp. 163-168 (2016) (Year: 2016).*
Huang, W., et al. "Accelerate the Autonomous Vehicles Reliability Testing in Parallel Paradigm" IEEE 20th Int'l Conf. on Intelligent Transportation Systems, pp. 922-927 (2017) (Year: 2017).*
Zoller, I., et al. "Knowledge Base for Valid Driving Simulation" ATZ Worldwide, vol. 117, issue 3, pp. 46-49 (2015) (Year: 2015).*
Franck Gechter et al., VIVUS: Virtual Intelligent Vehicle Urban Simulator: Application to Vehicle Platoon Evaluation.
https://uk.mathworks.com/products/automated-driving/features.html.
https://uk.mathworks.com/help/driving/examples/model-radar-sensor-detections.html.
http://www.vcrashusa.com/.
Franck Gechter et al., Towards a Hybrid RealVirtual Simulation of Autonomous Vehicles for Critical Scenarios; SIMUL 2014, The Sixth International Conference on Advances in Systems Simulation.

* cited by examiner

METHOD AND SYSTEM FOR MODIFYING A CONTROL UNIT OF AN AUTONOMOUS CAR

TECHNICAL FIELD

The invention relates to a method for modifying (particularly—further—developing) a control unit of an autonomous car, wherein the autonomous car is equipped with basic sensors wherein the data recorded by the basic sensors enable the control unit to control the autonomous car in autonomous driving mode. The invention relates also to a system for modifying a control unit of an autonomous car, as well as corresponding computer program product and computer readable medium.

BACKGROUND ART

Safety testing of autonomous vehicle development is a crucial part of the process. Hitting the road without ensuring everything will be in order, especially in public roads, can lead to situations the control system of the autonomous car is unprepared for and can result in cases where the safety driver should interfere, or even worse, an accident happens. Accordingly, several different approaches for safety testing is known from the prior art.

Based on the above reasons extensive testing has to be done. Thus, many approaches are known for simulation techniques which can help the development of the control unit of an autonomous car.

In US 2017/0132117 A1 a method and a device for generating test cases for autonomous vehicles are disclosed. The test case generation is based on a central database, the data of which are obtained from any kind of real vehicles of the traffic. The disadvantage of the approach of this document is that this kind of test case generation is considered to be suitable for developing a basic control unit; however, it is not considered to be suitable for handling unexpected cases. In US 2017/0132118 A1, in correspondence with the above document, a method and apparatus for testing software for autonomous vehicles are disclosed.

A hybrid simulation technique for simulating various situations is disclosed in Franck Gechter et al.: Towards a Hybrid Real/Virtual Simulation of Autonomous Vehicles for Critical Scenarios; SIMUL 2014, The Sixth International Conference on Advances in System Simulation.

A further article, Franck Gechter et al.: VIVUS: Virtual Intelligent Vehicle Urban Simulator: Application to Vehicle Platoon Evaluation, preprint submitted to Elsevier 2011 discloses a framework for building virtual reality. Disadvantageously, this simulator needs human interaction in many steps. Disclosures of other simulation frameworks can be found under the following links:
   https://uk.mathworks.com/products/automated-driving/features.html
   https://uk.mathworks.com/help/driving/examples/model-radar-sensor-detections.html
   http://www.vcrashusa.com/

A simulation framework is disclosed in DE 10 2007 053 501 A1. In this framework, a master scenario file is created from which a lot of similar scenarios are generated. Further simulation frameworks are disclosed in DE 10 2007 053 500 A1, DE 10 2008 027 526 B4, DE 10 2011 088 805 A1, US 2016/0210383 A1 and US 2017/0161414 A1.

In view of the known approaches, there is a demand for a method by the help of which the control unit of an autonomous car can be modified (developed further) in a more efficient way than the prior art approaches to enable it to respond, as well as possible, to unexpected situations.

DESCRIPTION OF THE INVENTION

The primary object of the invention is to provide a method for modifying a control unit of an autonomous car, which is free of the disadvantages of prior art approaches to the greatest possible extent.

The object of the invention is to provide a method by the help of which the control unit of an autonomous car can be modified (developed further) in a more efficient way than the prior art approaches in order to enable it to respond, as well as possible, to unexpected situations. Accordingly, the object of the invention is to make it possible to develop further the control unit of an autonomous car based on scenarios (unexpected cases) which cannot be constructed normally in the simulator and which would not in general be covered by the cases generated (artificially) by safety engineers.

Basically, the object of the invention is to make further development on the control unit of an autonomous car. In other words, to make it sharper and more responsive to unexpected situations preferably after a basic control framework has been developed with the help of a database comprising a large number of ordinary, everyday scenarios.

The objects of the invention can be achieved by the method according to claim 1. Preferred embodiments of the invention are defined in the dependent claims.

The main advantage of the method according to the invention compared to prior art approaches comes from the fact that the framework of the invention is built on disengagement events, more particularly on disengagement reports connected to disengagement events. Disengagement events are the result of unexpected situations, which are to be handled by the control unit of the autonomous car. Since a disengagement corresponds to a situation in which the autonomous car is not able to control itself anymore, a disengagement event directly points to a component of the control system of the autonomous car which is to be modified (developed further).

None of the above cited prior art approaches uses test cases being in correspondence with a disengagement event. Consequently, there is no functionality in the prior art approaches to reveal the causes of the interruption of self-driving (i.e. a disengagement), which analysis leads to an efficient identification of the part of the control unit which is to be modified (improved). Thus, in revealing (identifying) the to be modified (improved) areas of the control, the method according to the invention is more efficient than the prior art approaches. The invention focuses on only critical parts of the real-world tests by using all available information prior to the disengagement and reconstructing only the relevant parts of the test to maximize the usefulness of the scenario testing pipeline.

To sum up, according to the invention (new) scenario files are created when a disengagement event happens, while many prior art approaches (such as DE 10 2007 053 501 A1) work using existing scenario files (or by generating new cases based on existing cases). Unlike some prior art approaches, according to the invention the car's integral sensors are not used, but those sensors are used which were specially calibrated and added to the vehicle (in many of the prior art approaches, information is collected only from the internal behavior of the autonomous car, like braking, steering, etc.). The role of these sensors is to reproduce scenes exactly as they happened. According to the invention a visually good, deterministic simulator is used, so the runs can be repeated several times and by providing the exactly same inputs the same outputs will be obtained.

Accordingly, it is noted, that by the help of the invention, the weaknesses of the control unit (the control unit—preferably as a part of a control system—is implemented preferably by means of a (control) software or by means of a combination of a software and hardware elements) of an autonomous car can be improved in a highly efficient way. In other words, by using disengagement events as events to be simulated, events which are considered to be unexpected can be captured and handled. Processing disengagement events in a simulator using the autonomous car's control unit trained with basic situations (this is called basic control framework above) instead of a large number of artificially generated test events makes the framework according to the invention highly effective, since every single disengagement event leads to a modification (development) in a component of the control unit when it is analyzed, what was the cause of the disengagement. Accordingly, in the invention, the modification (development) of the control unit is preferably started from an (already developed) basic level control unit which is to be made responsive to unexpected events.

In the method according to the invention, the building of a virtual world (and the scenario therein) based on the disengagement related (log) data is performed preferably automatically. Furthermore, based on the recorded disengagement related data, also the virtual scenario (comprising surrounding cars with their characteristics and behavior) is generated automatically. According to the deterministic runs in the simulator, the cause of the disengagement (interruption of the autonomous mode) can be reproduced, debugged and fixed virtually.

In the method according to the invention preferably no manual work is required to convert real-life scenarios to virtual ones so there's no need to account for human-error. This is also advantageous from the point of view that some details of a scenario would be very hard or even impossible to follow with human processing (e.g. when cars of the traffic other than the autonomous car are to be followed). The method generates a precise representation of the real-life scenario, which precision could not be achieved by manually trying to reproduce it based on the available recordings. Since the method according to the invention preferably only requires computational power, it can be scaled efficiently regardless of the available manpower. The generated log file is universal, i.e. meaning it does not depend on a single virtual simulator or scenario testing framework, so it can be used in any system.

Further advantages of the invention are also detailed below. According to the invention validation data (generated in some embodiments by means of a validator sensor) may be preferably used to allow finding the cause of the disengagement also in cases when the cause cannot be revealed based on the basic sensors of the autonomous car.

Furthermore, in the framework of the invention, different levels of re-testing are available in simulations where the adequacy of the control unit after the modification may be checked (see step S70 and a further verification step below).

The invention is in other words a method to recreate real-life safety scenarios in a virtual environment for autonomous vehicle development, testing and validation, based on recorded and post-processed sensor data.

BRIEF DESCRIPTION OF THE DRAWINGS

Preferred embodiments of the invention are described below by way of example with reference to the following drawings, where.

MODES FOR CARRYING OUT THE INVENTION

The invention is a method for modifying (developing, improving) a control unit of an autonomous car. The autonomous car applied in the method according to the invention is equipped with basic sensors adapted for recording data based on which a fusion model of objects and the environment surrounding the autonomous car can be generated (the fusion model is generated—created, built—based on data collected from the basic sensors; e.g. from cameras which are part of the basic sensors and which are directed outwards in different directions from the autonomous car), wherein the data recorded by the basic sensors enable the control unit to control the autonomous car in autonomous driving mode, i.e. to control the car operation devices (in autonomous driving mode the steering wheel, the pedals and other car operating devices are controlled by the control unit).

Accordingly, the basic sensors make an autonomous car suitable for travelling in autonomous driving mode. The different kinds of sensors needed for this purpose are known from autonomous cars available at present (see also the example of FIG. 1 below).

As it is illustrated in connection with FIG. 1 there is a minimum group of the basic sensors (which may be called external sensors or sensors for detecting the environment of the autonomous car, sensors "looking" out of the car) with the help of which the autonomous driving is achievable (in respect of basic sensors, a minimum sensor pack by the help of which the fusion model of objects and the environment surrounding the autonomous car can be generated). However, by using additional sensors the control may be made more sophisticated.

Figure 2:
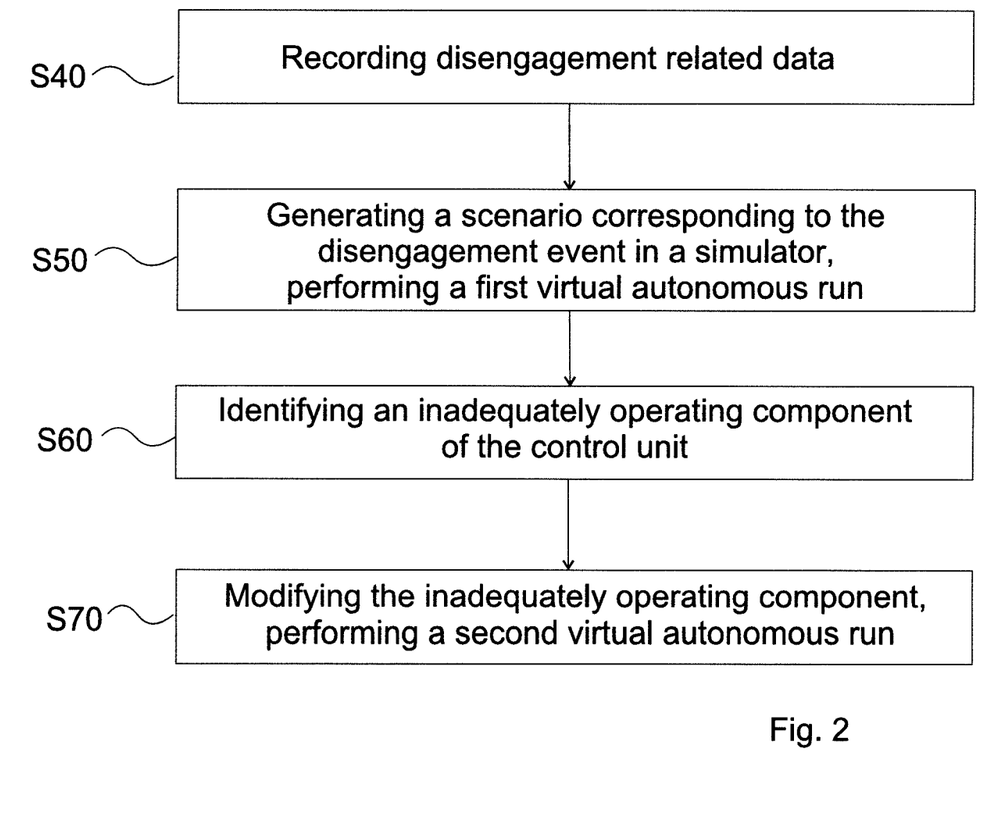
FIG. 2 is a flow diagram of the steps of an embodiment of the method according to the invention.

The method comprises the following steps as illustrated in FIG. 2 (only an essence of the step is displayed in FIG. 2 for each step).

As a first step (step S40 in FIG. 2) triggered by a disengagement event in a first state of the control unit of the autonomous car (i.e. when the control unit is in a first state), disengagement related data (or simply disengagement data) comprising sensor data recorded by the basic sensors is recorded during an autonomous test action performed in autonomous driving mode of the autonomous car, said recording being carried out in an analysis time window before the disengagement event. Accordingly, in a first step the disengagement related data are recorded for further use; this step is performed on-line, i.e. during test travel in autonomous mode.

Then a virtual scenario is generated in a simulator apparatus for the analysis time window based on the disengagement related data (i.e. a scenario corresponding to a time period of analysis time window before the disengagement event is created), wherein the virtual scenario comprises a virtual counterpart of the autonomous car having virtual counterparts of the basic sensors (i.e. virtual sensors with the same functionality as the real-world basic sensors), and a first virtual autonomous run according to the autonomous test action is performed with the virtual counterpart of the autonomous car (the autonomous car has its own role in the scenario, it is also tracked just like the objects and their behavior in the surrounding environment) using the first state of the control unit in the simulator apparatus, so that the first virtual autonomous run lead to the disengagement event in the virtual scenario (step S50 in FIG. 2). The virtual counterpart of the autonomous car has virtual sensors which are counterparts of the real basic sensors of the autonomous car in the reality. The virtual counterpart of the autonomous car is controlled based on the signal of the basic sensors making detections of the outside world starting from a well-defined starting state of the scenario and the car operating devices are controlled by the control unit in autonomous mode.

The run is autonomous, i.e. the virtual counterpart of the autonomous car is controlled by the control unit. The first virtual autonomous run is performed according to the autonomous test action (in the previous step, data of this—i.e. the same—autonomous test action were recorded), which means that the autonomous car starts from the same state as in the real test and it is autonomously driven—i.e. also in the virtual world—by the control unit in the following. If the scenario is generated (constructed, created, built) in an acceptable quality (see below), then the real scenario is reproduced well and the first virtual autonomous run will also lead to a disengagement (it is required, see above).

The scenario has to be built in such a quality that it is so similar to reality that the scenario also leads to a disengagement also in the virtual space. To achieve a scenario built in an acceptable quality, it may be necessary to use validation data. This is relevant since the control ran into a disengagement based on the real circumstances, thus, to reproduce the disengagement in the first virtual run, it is necessary to build the surrounding action similarly to the reality as possible (this is necessary for having those control decisions during the time period of the scenario in the first virtual run which has been resulted in disengagement).

This quality of reconstruction of the real scene is achievable according to the reconstruction techniques available recently. It is relevant for the further steps to reach the disengagement virtually in this step, since it is needed for exploring the cause of the disengagement which is to be done virtually based on the disengagement related data. Step S50 and consecutive steps are performed offline based on the disengagement related data captured during autonomous driving of the car.

Accordingly, in a further step (step S60 in FIG. 2), based on the virtual scenario, an inadequately (insufficiently) operating component of the control unit is identified (i.e. the part of the controlling which is to be modified for avoiding that type of disengagement which has happened), wherein the disengagement event has been caused by inadequate operation of the inadequately operating component of the control unit. A component of the control unit of the control unit may be every (self-contained, standalone) part of the control unit (see below for examples), it may be called subunit. Similarly to the control unit, the components may be implemented by more or less separated blocks (modules) of the control software or by means of a combination of software and hardware.

After that, a second state of the control unit (the first and second state of the control unit may also be called starting and upgraded state, respectively) based on the first state of the control unit by modifying the inadequately operating component of the control unit (i.e. the second state of the control unit can be obtained from the first state thereof by the modification of the identified component of the control unit), and a second virtual autonomous run according to the autonomous test action is performed with the virtual counterpart of the autonomous car using the second state of the control unit in the simulator apparatus (step S70 in FIG. 2), checking whether the disengagement event is avoided in the second virtual autonomous run, and storing the modified component of the control unit if the disengagement event is avoided in the second virtual autonomous run. If the disengagement were not avoided in a second virtual autonomous run (i.e. for the first checking virtual autonomous run is made), then the modification can be continued. At a later stage of the modification, a new virtual autonomous run can be performed. The modification procedure can be considered so that the "second" virtual run (may be also called as further virtual run) corresponds to that virtual run which is performed after the finally successful modification. Accordingly, the intermediate virtual runs may be considered as the part of the modification (development).

Accordingly, the goal of the modification (development) of the identified component of the control unit is to make such an improvement in the control that the disengagement will be avoided by the autonomous car using the improved control. The second virtual autonomous run is also performed according to the autonomous test action (it starts from the same status as in the real test in autonomous mode), but the virtual counterpart of the autonomous car is operated by the second state (i.e. the improved version obtained by the modification) of the control unit. It is the goal to avoid the disengagement with the updated control unit on which the appropriate modification (development, improvement) has been performed.

It is important to note that basically two separate causes can result in the disengagement corresponding to the interruption by the safety driver of the autonomous car or by the control unit itself (see the examples below). In case of a first type cause, the detections performed by the sensors were accurate, but an incorrect decision was made by the control unit in spite of the knowledge of the accurate fusion model.

An example for this type of cause is the following: the sensors, based on a road sign (traffic sign) designating the speed limit have detected accurately that the maximum speed may be 50 km/h, but in spite of the accurate detection, it has not been decided by the control to lower the speed. In case of this type of cause, the basic sensors are sufficient to reproduce the scenario in the simulator (i.e. the optionally applied validator sensor is not needed). Thus, the exemplary sensor pack illustrated in FIG. 1 is sufficient for reproducing the above type of disengagements for which no validator sensor is needed (first type disengagement). In the case of first type disengagement the fusion model generated by means of the basic sensors in the analysis time window is found to be acceptable, i.e. the fusion model remains unchanged. Thus, the (whole) fusion model is considered to be acceptable, if the disengagement was not caused by an inaccuracy of the fusion model, but it can be determined that the control decisions of the control unit are to be modified. Accordingly, after modifying the identified component of the control unit, the second run is performed in the same fusion model (in case of a first type disengagement, the modified component is not responsible for building the fusion model, but it takes part in making control decisions).

In case of the other (second) type cause, the detections were not accurate (correct), and thus an inaccurate fusion model was generated during the real-time fusion (in other words, the fusion model generated by means of the basic sensors in the analysis time window is found to be inacceptable in at least a part of the analysis time window), then the autonomous car reacted to this inaccurate fusion model, and the disengagement was the consequence of this reaction to the inaccurate fusion model (see the example below where the distance estimation—part of the fusion model—of the autonomous car is inaccurate). In this case it is conceivable, that based on the subsequent analysis of the recordings, the accurate fusion model can be generated, but it may be the case that the validation data (e.g. data of a lidar device, see below for details) will be needed to reproduce the case in the simulator, because the inaccuracy of the detection cannot be corrected by the help of methods based on the available recordings and logs.

Such a disengagement is also conceivable when the control unit of the autonomous car gets into an indefinite state, in which it initiates giving back the control to the safety driver. To this case, a simple example is when a control framework (software) designed for motorways cannot detect lanes and road surface in front of the autonomous car in a stable way.

According to the above details, in the case of second type disengagement, an inaccurate fusion model was generated real-time by the fusion, as well as by the reconstruction of the scenario. If the identification of the inadequately operating component of the control unit is right and its modification is successful, then the fusion model will be reconstructed accurately—the fusion model becomes acceptable for the whole length of the analysis time window—according to the improved control unit (e.g. when a distance estimation was inaccurate before the modification of the control unit, the object, which was placed previously to an erroneously estimated distance by the fusion, will be positioned accurately after the modification), and the disengagement will be avoided (see below for cases when validation data are used for first type disengagement).

In the above described embodiment of FIG. 2, the testing of the second state of the control unit (the so-called second control software state) with performing the second virtual autonomous run in the simulator is the last step.

In case of a first type disengagement, the autonomous car travels in the simulator when the control unit has been modified so as to have a second state in the same model space created by the fusion as in the failing run (running into a disengagement) of the first state of the control unit. As mentioned above, in case of a first type disengagement, the disengagement was not caused by inaccurate fusion model. By the second state of the control unit, the expectation is to avoid the disengagement event when the second virtual autonomous run is performed, i.e. that the scenario continues after the critical point.

In an embodiment with first type disengagement, the above step is preferably followed by a further optional verification step. In this step the control unit is tested again on real recordings, which are connected to the disengagement report, i.e. which are parts of the disengagement related data. This may be an additional verification step, by the help of which the safety of the control unit can be enhanced. This is because, if the controlling software is trained for more details and tested with more types of data, i.e. the circumstances are reproduced better, the results will be better. Accordingly, in this embodiment, if the fusion model generated (created, built) by means of the basic sensors in the analysis time window is found to be acceptable in the analysis time window, after performing the second virtual autonomous run, a third virtual autonomous run according to the autonomous test action is performed with the virtual counterpart of the autonomous car giving the disengagement related data (sensor data of the basic sensors and optionally other log type data) to virtual counterparts of the sensors of the virtual counterpart of the autonomous car using the second state of the control unit in the simulator apparatus.

In this further optional step, the control software (unit) of the autonomous car is tested in a special state, where all of the sensor data come from the original recordings (i.e. the original sensor data are utilized). However, the original commands (steering wheel angle, pedal position) are not performed; these parameters are only compared to the previous data of the log in the disengagement report, and the results are checked and accepted if comparisons are between certain limits. It can also happen that the car not only behaves differently near the original disengagement, but it travels differently on a longer section, therefore the critical situation is avoided by different behavior. This can be tested by comparing the commands made in the present step when the real recordings were used, to the commands of the log of the previous step where the second state of the controlling unit was tested in the simulator. This not an easy way of testing, since if the car deviates to a larger extent from its original path, then the recordings get desynchronized. However, it can be determined during the simulator testing of the second state of the control unit, whether the revised control software implemented by the control unit can be tested by the original recordings or not.

During road tests an autonomous vehicle can either be driven by the safety driver manually or can be in autonomous mode. While the car drives itself, it uses several different sensor's data to make decisions on whether to brake, accelerate or steer. The sensors being used on an autonomous car may be cameras, radar, lidar, or GPS; HD map data or any other source of information (see the example below illustrated in FIG. 1) may also be used for the decisions. However not all sensors are suitable for high speed driving, such as on highways mainly because of the latency of the sensors (see below in details).

An autonomous car 30 is equipped with the following sensors in an example (this external sensor pack is optimized for travelling on a motorway, but applicable also for other types of roads). The parameters of the sensors are the following. The position (pos) values are given in meters in a "forward (x), left (y), up (z)" coordinate system, the origin (location with [0,0,0] coordinates) is placed where the middle of the rear shaft of the car is projected onto the ground. The yaw, pitch, and roll values are given in degrees.

Figure 1:
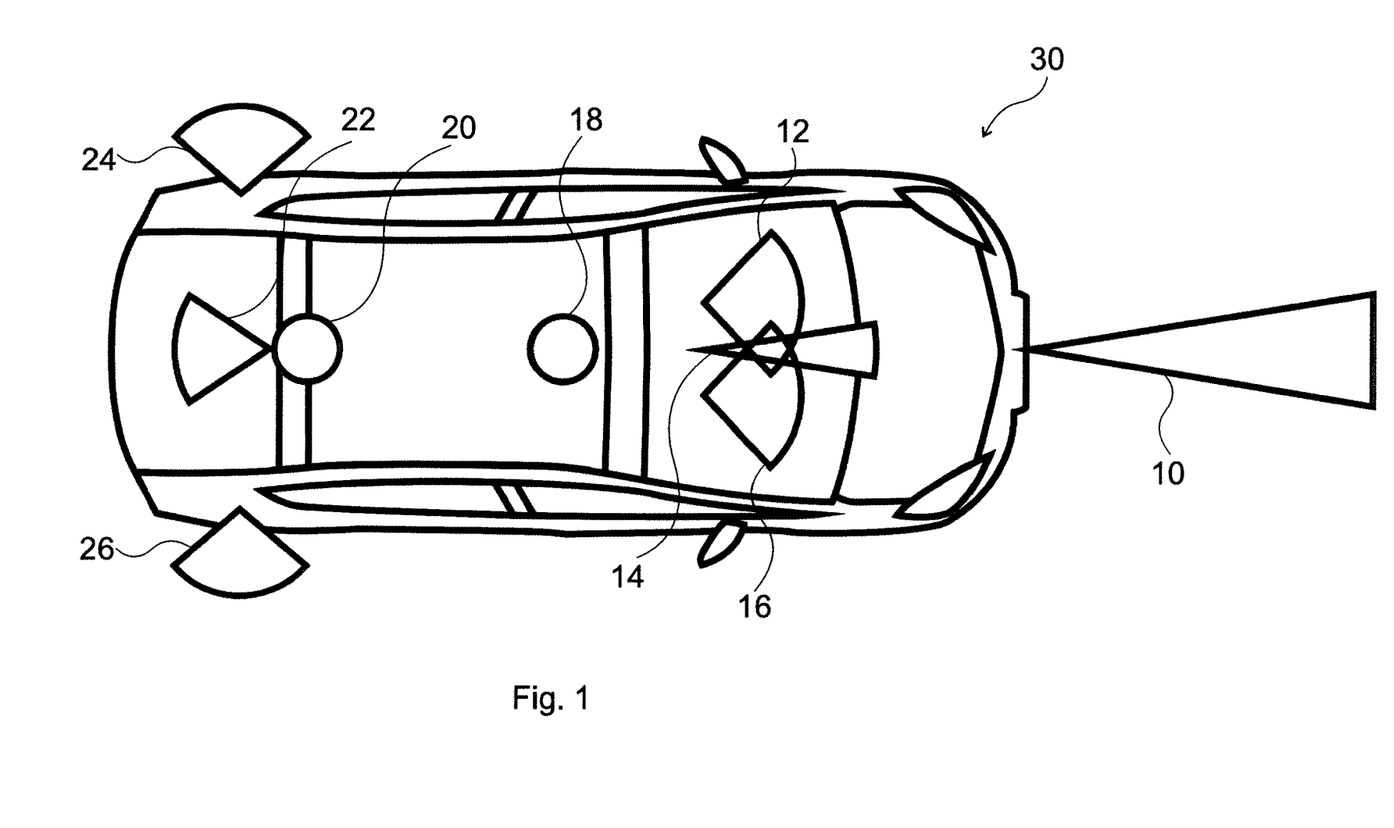
FIG. 1 shows an exemplary autonomous car with various sensors.

F_RADAR_C, pos: [3.6, 0, 0.76], yaw_pitch_roll: [0, −20, 0] (sensor 10 in FIG. 1, it is arranged at 3.6 m from the origin (on the front panel of the car), at a certain height; the pitch value is −20, which means that it is tilted a bit onto the road)

F_MIDRANGECAM_CL, pos: [1.885, 0.2, 1.2], yaw_pitch_roll: [0, −2, 0] (sensor 12 in FIG. 1)

F_MIDRANGECAM_CR, pos: [1.885, −0.2, 1.2], yaw_pitch_roll: [0, −2, 0] (sensor 16 in FIG. 1; sensors 12 and 16 are arranged symmetrically to the forward symmetry axis in 40 cm distance from each other)

F_LONGRANGECAM_C, pos: [1.885, 0, 1.2], yaw_pitch_roll: [0, 0, 0] (sensor 14 in FIG. 1, this camera sensor 14 is arranged on the forward symmetry axis, i.e. halfway between sensors 12 and 16)

M_WIDE_L, pos_meter: [0.03, 0.75, 1.2], yaw_pitch_roll_deg: [−85, 30, 0] (sensor 24 in FIG. 1)

M_WIDE_R, pos_meter: [0.03, −0.75, 1.2], yaw_pitch_roll_deg: [85, −30, 0] (sensor 26 in FIG. 1, sensors 24 and 26 are arranged on the two sides of the car, at the same height as sensors 12, 14 and 16)

B_MIDRANGE_C, pos_meter: [0.15, 0, 1.45], yaw_pitch_roll_deg: [180, −7, 0] (sensor 22 in FIG. 1, this sensor is arranged on the forward symmetry axis at a larger height than sensors 12, 14, 16, 24, 26)

IMU_PRIMARY (sensor 18 in FIG. 1)

GPS_PRIMARY (sensor 20 in FIG. 1; sensors 18 and 20 are arranged on the forward symmetry axis)

Sensors 10, 12, 14, 16, 22, 24, 26 are denoted by a symbolic arch starting from the position of the sensor and become wider.

Sensor 10 is a radar arranged at the front panel of the car 30. It is optional to use the radar sensor 10 in the fusion in autonomous mode. It may be preferred to use sensors 12 and 16 for distance measuring in front of the car; sensors 12 and 16 are middle range cameras constituting a stereo camera pair which is suitable for measuring the distance of objects from the car in front of the car. Sensor 14 is a long range—e.g. pinhole type—camera, which is preferably used because distant objects are very small in an actual picture of the stereo camera (a video footage is recorded by the cameras arranged on the car as sensors, which can be analyzed picture by picture). With the help of long-range camera sensor 14 a better image can be obtained of distant objects which is preferred in the fusion (to obtain certain information about the cars in front the autonomous car, e.g. color of the car, use of car lights and turn signals, etc.). In the illustrated example sensors 10, 12, 14 and 16 can be used to explore the environment in front of the autonomous car.

Additionally, the car 30 is equipped with sensors 24 and 26 which are cameras, preferably fish-eye (side-seeing) cameras to see the objects at the sides of the car. It can be recorded by these cameras if a car overtakes the autonomous car 30 or the autonomous car 30 overtakes another car. In the illustrated example a sensor 22 is also arranged on the car 30 which sensor 22 is a camera seeing behind the car 30. By the help of this camera sensor 22 the scene behind the autonomous car 30 can be explored (e.g. cars which are approaching and cars slower than car 30 which become smaller and smaller on the picture of camera sensor 22).

For measuring the position and the tilt of the car 30, a GPS (global positioning system) sensor 20 and a tilt sensor 18 (IMU—inertial measurement unit) are arranged on the car 30. These positions of these are illustrated in FIG. 1.

The basic sensors in the example may be all the sensors illustrated on car 30 except radar sensor 10, pinhole camera sensor 14, tilt sensor 18 and GPS sensor 20. However, if these sensors are also part of the basic sensors, it is likely that the fusion can be done with better precision. Less or other sensors (e.g. single camera sensor instead of sensors 12 and 16) may be sufficient to act as basic sensors. Similarly, the number of sensors can also be increased to give data being part of the disengagement related data. Accordingly, the disengagement related data may comprise recordings and logs of various sensors.

Optionally, the autonomous car is equipped with internal sensors adapted for measuring a status of car operation devices of the autonomous car, in particular steering wheel, gas pedal, and brake pedal (car operation devices may be other devices which are required for the operation of the car and need to be controlled when the autonomous car is driven in autonomous mode), but it is not necessary to use these sensors and these sensors are not necessarily arranged in an autonomous car. In an autonomous car the car operation devices (e.g. steering wheel, gas pedal, and brake pedal) are operated by the control unit, but the status of these car operating devices is not necessarily checked (measured) continuously. The internal sensors may have a role as a validator sensor.

In case something unexpected happens or the vehicle tries a maneuver it shouldn't, the safety driver can interfere and take back partial or full control over the vehicle. These events are called disengagements, and when a disengagement event happens a report is generated by the vehicle based on what has happened up to the control takeback (the elements of this report—more generally it is called disengagement related data—are used subsequently by the invention). The report is generated preferably automatically, when the control is taken back. The report (disengagement related data) comprises all recorded sensor data from the previous minutes (i.e. in an appropriately selected time window) along with logs from the vehicle, where different software states and variable values can be observed. This report can later be used for further analyzing the reason of the disengagement.

Safety scenario testing of an autonomous car enables quick iterations of the development process of the control of the autonomous car by providing a virtual environment of a simulator. In the virtual environment of the simulator the vehicle control software can be validated in different situations and tested against not only developer expectations, but safety requirements too (it is efficient to use a simulator for developing the control software, not only real road testing). Recreating real world locations and situations exactly as they are in a real-time, photorealistic simulator is crucial for scalable testing. Using the framework of the present invention (which may be called scenario pipeline) different road scenarios can be created in fine details.

A standalone scenario editor tool is being used for such tasks (i.e. for generating scenarios virtually). Vehicles, pedestrians and animals can be placed first into the scenario, then they can be parameterized—according to their moving—further down the road. Several different options are available for vehicles for example, car type, color and attachments can be defined before spawning. Initial speed can be set and can later be changed based on various timers or events.

Since lots of dynamic tests can be defined during the scenario, even highly complex situations can be created. During the execution of the scenario in a virtual simulator, several conditions can be checked to see if the autonomous (ego) vehicle behaves as expected, for example if it keeps lanes and target speed, performs overtake and can exit highways safely, just to mention a few examples.

The software modified (developed) autonomous vehicle control unit can be connected to the simulator either by running them on the same computer or by connecting them on a network. During the simulation the simulator provides all sensor data which are requested by the vehicle control software similarly to the way it would happen in real life (all of these data—e.g. pictures of cameras, range values—is generated based on the simulated scenario, which was formerly generated based on sensor data of the autonomous vehicle during testing), and the vehicle control software processes the returned data the same manner as it would do during road testing. In other words, the full scenario is generated in the simulator (with the participant cars including the autonomous car itself, as well as other objects from the surroundings of the autonomous car) and the virtual counterparts of the sensors of the autonomous car make measurements and recordings of the scenario, i.e. of the surrounding virtual world. The control software can send control messages back to the simulator which obeys these and executes the requested acceleration, braking and steering commands received from the vehicle software.

By using this test method in the simulator, it can be ensured that before doing road tests all the relevant modules of the autonomous vehicle software are reliable and operational. Since real world locations can be modelled in the simulator, the control unit can be virtually tested even on the same road segments which will later be tested in real life, so we can prepare for any issues typically occurring on specific locations.

Creating artificial situations can help the development to cover different corner cases which may only happen in real life very rarely, but these situations are usually very sterile and only test specific functionalities in a vacuum. Situations like that generally appear in the prior art approaches, where it is the intention that the corner cases be covered because of the huge number of test cases. However, real corner cases are very hard to generate and cannot be covered simply by increasing the number of test cases up to very high numbers. This difficulty is resolved by the help of the invention making the development based on the cases where disengagement has happened, i.e. a special corner case capturing is done by the invention.

While doing road testing there can be several other vehicles around the ego (autonomous) vehicle and they can perform unexpected maneuvers, brake or steer immediately, etc. By using all (road-test) recordings and disengagement reports from road tests, specific cases can be recreated and tested exactly as they happened in real life, and a much wider range of examples (functionality of the control unit) is covered compared to the artificial tests. This gives developers the option to repeat the same scenarios virtually, further analyze the possible issues and fix them accordingly. A corner case is "captured" via a disengagement event, since the disengagement event is always caused by an operation of the control (fusion algorithms, control protocols, insufficient information from sensors arranged on the autonomous car) which is to be developed further (modified).

According to the invention, being able to validate changes in the vehicle control software and test it in the exactly same situations it failed earlier and see if the changes that have been made indeed improved the quality of the software is very preferable. That is, in other words, the disengagement is avoided by the improved control software, when the new version of control software is tested on the same scenario, which virtual scenario has shown the disengagement—just like in real life—before the appropriate component of the control software has been modified. There is no longer need to spend time on driving to specific locations, or try to recreate the same situations in the real world, since this can be easily done in the virtual simulator. This possibility does not only reduce the time and cost spent on development (the corner cases, thus the weak points where development of the control software is needed can be captured highly effectively through disengagement), but also makes it possible to test some cases which would otherwise be impossible to reproduce. Scenes with many participants may be a good example for this. Considering e.g. four cars: it is impossible to reproduce the position of these in a curve at high speeds.

As small differences to the environment can matter, recreating specific situations in a virtual environment is a key to deterministic results (e.g. for getting back the disengagement event when the same software state is tested). Doing this work by hand would not only be extremely time-consuming, but even impossible (e.g. when the movement of other cars is to be followed), so automating this process is the only way to achieve the desired results.

In the following part, fusion for scenario generation is described in details. To be in line with the denominations used in the art, the fusion model (which is the result of fusion data creation) will be used in connection with models for space created by the fusion (it may be also used for the step itself when the different sources of data are fusioned). The offline created model for space may be simply called model space (accordingly, the model space is generated by post-processing). Both models contain all the necessary information of the surroundings (online: for control; offline: for reconstruction). The fusion is composed and updated real-time based on various camera, sensor, GPS, navigation and map data, and is used by the autonomous vehicle control logic to determine what to do (the control logic makes a decision about how to continue based on this information of the surroundings).

Although the process of fusion data creation is not in the scope of this document, some aspects should be taken into consideration. The control logic can be considered safe when running above at least 10 Hz, so even at high speed it can make decisions relatively quickly. Traveling at 130 km/h for example will result in a chance to make decisions every 3.6 meters (at 10 Hz), and thus can be considered safe. In order to achieve this performance only those sensors can be used, which can produce reliable data during this timeframe, so from triggering the signal of requesting data, the capturing of the sensor, and the processing of the analyzing algorithms should give enough time for the fusion model to be updated and the control decision to be made, and these altogether should not take more than a maximum of 100 milliseconds. A regular camera which can be used on autonomous cars have a latency of 15-21 milliseconds, while a normal radar can take up between 25 and 45 milliseconds to produce data which can be used by the algorithms. Accordingly, the above cited time periods cover the time from triggering to capturing sensor data. The sensor data is utilized by the control time to time separated by fix time intervals, thus the time assignable for analyzing and control decision depends on the above mentioned latency times.

When certain sections of a motorway are tested, the control unit and the sensors arranged in the car (sensor system) have to handle problems originating from the high speed. The basic aspects are the detection range (range of vision) of the cameras, as well as the reaction time of the control unit. A relevant problem may be that in the images recorded by the cameras a car which is at a distance of 100 meters may be so small that it may cause inaccuracy in the detection algorithm. On the other hand, in case of city travel, the velocity of the traffic is much slower, however, the environment is much more diversified (traffic signs, traffic lights, zebra crossings, bicycle roads, etc.) and the participants of the traffic are of higher number and may behave in many various ways. While in a motorway the cars are travelling along the lane or changing lanes, in a city there are numerous crossroads, exit lanes, etc. There are many pedestrians, bicycle riders, roller riders or riders of other means of traffic on the pavement, whose behavior cannot be easily estimated and/or is not consistent.

According to the invention, validation data (recorded e.g. by means of a validator sensor) can be used preferably in an embodiment, if the scenario cannot be appropriately reproduced based on the basic sensors (which may be also called sensor base pack). As mentioned above, use of validation data may be needed in the case of a second type disengagement, i.e. where the generation of an inaccurate fusion model is revealed. The validation data are applied for validating at least part of the scenario (that part which cannot be reproduced in a good enough quality based on the data of the basic sensors, it can be a part of the space for the whole analysis time window but it can be the whole or a part of the surrounding space for a part of the analysis time window), i.e. to explore and identify an inaccurate detail of the fusion model.

The validation data are a source of data and/or a type of data which are not necessarily used in the fusion but can provide ground truth data of the environment in a reliable way.

Validation data can be any (derived) data which is not used real-time for controlling. Even if it is slow and cannot be used real-time, the validation data can help to improve the quality of the offline generated model for the space, i.e. to produce a more precise representation of the surrounding environment and objects.

The validator sensor (validation sensor) producing validation data may be a radar or lidar for example, but raw video footage can also be utilized as a source for validation data processed appropriately offline (in this case the validation data is obtained from the data of the same sensor—a camera—the footage of which is used during real-time fusion when the car travels in autonomous mode differently processed) since even the slowest detection algorithms are viable in the preprocessing part of the scenario generation (i.e. when the scenario is reproduced), and these can be much more precise than the ones used real-time under the speed limitation because now the output is not needed to be produced real time.

Accordingly, in an embodiment of the method according to the invention, if the fusion model generated by means of the basic sensors in the analysis time window is found to be inacceptable in at least a part of the analysis time window, validation data are used in generating the virtual scenario for validating a validation scenario part of the virtual scenario based on comparing a validation model of the validation scenario part to the fusion model of the validation scenario part for at least a part of the analysis time window, and the inadequately operating component of the control unit is identified by means of the comparison of the validation model of the validation scenario part and the fusion model of the validation scenario part for at least a part of the analysis time window (the fusion model is time dependent, it can be created for every time step in the analysis time window; the validation data can be used during the whole analysis time window, but it may be used also in a part of it, since for other time periods the fusion model is acceptable). The validation scenario part of the virtual scenario is a certain part of the scenario. The scenario is represented by time dependent data about the surrounding objects, i.e. the validation scenario part may be for example the data corresponding to the approaching movement of a dedicated car.

This part of the scenario will have a validation model besides the fusion model coming from the disengagement related data.

The validation data—used for building the scenario in an acceptable quality—help also in identifying the inadequately operating component of the control unit.

Thus, the identification is made based on the virtual scenario, but, if validation data are available, it will contribute to the identification, since the scenario of better quality has been obtained using the validation data.

Based on the comparison of the validation model and the fusion model of the validation scenario part such differences may be found in the models based on which it can be identified which component of the control unit is responsible for the differences (in particular, which component is responsible for the deviation from the validation model, which is considered to be the ground truth in many cases).

Considering the distance estimation example, it will be clarified that the distances in the fusion model are different from the distances observed in the validation model. Thus, it is clear that the appropriate (responsible) distance estimation component of the control unit is to be developed further (i.e. it is to be modified).

The validation data are recorded by a separate validator sensor or it is available from a basic sensor the differently processed data of which is used also in the fusion. For validation data available from a basic sensor the above mentioned raw data is a good example.

Raw data of a camera are processed by fast algorithms for using in the fusion. However, processed by slower, more sophisticated algorithms for obtaining more precise detection, validation data can be obtained from raw data (i.e. the validation data are obtained in this case by the help of a validation data generating offline algorithm from raw data).

Using the slower processing, it could not be used in the fusion.

The validation e.g. shows that the distance of a concurrent car was estimated erroneously, i.e. it was placed to a wrong position in the fusion model. When the component of the control unit responsible for this estimation is modified, the estimation will be made appropriately by the help of the modified, further developed control unit (by its second state).

Since the distance estimation component was the inadequately operating component, in this example there will be a change in the fusion model generated using the second state of the control unit, compared to the fusion model generated in the first state of the control unit.

In a further embodiment, the autonomous car is equipped with a validator sensor adapted for recording the validation data.

The validator sensor may be any sensor; i.e. it can also be a sensor the data of which are used in the online fusion, but its data—processed offline—is suitable for validation. In this case, the validation data are obtained from a sensor the data of which are used in the real-time fusion (e.g. when the validation data are raw data).

However, in an embodiment, the validator sensor may be a separate sensor from which only validation data are obtained (e.g. the data of this sensor are not suitable for using in the fusion, see the description of a lidar sensor in this respect). Thus, this validator sensor is different from the basic sensors.

The validator sensor is a lidar device in an embodiment.

The latency of a lidar sensor is between 100-250 milliseconds, and thus can't be used real-time on high-speed roads or at high decision making frequency. Accordingly, lidar could be used e.g. by low speed for fusion, but mainly for testing only, since a lidar device is very expensive, it cannot be placed on every autonomous car. Similar considerations are valid for radar; the function of these should be provided by other—e.g. camera based—sensors.

However, the data captured by the sensor can still be subjected to offline software correction afterwards (e.g. lidar data recorded by high speed can be distorted, which distortion can be corrected by the help of the appropriate software) and can be used as ground-truth data for improving the fusion data.

Accordingly, software-improved lidar data can be also used as validation data.

Thus, the role of the validator sensor is to help the correction of the fusion model built based on the sensor data for the simulation of a scenario.

For this, the inaccuracy of a distance estimation algorithm may be a good example (see below for details): in the real-time fusion model the other car is estimated to be at a distance of 130 meters, and if only this information was used, then in the scenario built based on the disengagement report, this car would be started from a distance of 130 meters (i.e. the autonomous car would have enough time to perform the lane changing maneuver).

The role of the validator sensor is to correct this kind of inaccurate information (the inaccurate distance estimation).

Assume that a lidar was arranged on the autonomous car, and it detected accurately that the (red) car was behind the autonomous car at a distance of 80 meters when the overtaking had been started.

Accordingly, if the data of the validator sensor is used for the improved scenario made based on the logs, the (red) car will be at 80 meters also in the improved scenario, and then there will not be enough time in the simulation for overtaking.

At the same time, in this case the validator sensor helps to find the to be modified (developed) part of the control unit: it is clear from the validation data (80 m) that the distance estimation algorithm of the control unit is to be improved.

According to the above details, in an embodiment using a lidar device as a validator sensor a distance estimation component of the control unit is identified as the inadequately operating component of the control unit, and the distance estimation component (measuring distance in any direction around the car, e.g. in front of the car, behind a car or at a side of the car) is modified for generating a second state of the control unit based on the first state of the control unit.

Estimations for distances can be validated by the help of a lidar device.

Since, the sensor for estimating the distance of the object in front of the autonomous car is preferably a stereo camera pair, the distance in this direction is preferably estimated with good accuracy.

However, the sensor "seeing" behind the autonomous car is a single camera directed to record a footage from the scene behind the autonomous car in the example of FIG. 1, so it is conceivable that the distance estimation component (algorithm) using the data of this sensor is to be developed to reach good accuracy in various situations.

In the following part some details of the fusion are described.

Fusion data should contain the following parameters of all surrounding vehicles at any given time.

Only those vehicles should be modelled which can be tracked for the full length of the scenario, or if an educated guess can be given why a vehicle appeared or disappeared suddenly based on GPS or map data (e.g. it goes away on a highway ramp, intersection, etc.).

The goal is to filter out detection errors, which may be such "objects" which appear and disappear suddenly.

Thus, this filtering cannot lead to the losing of a nearby car, the behavior of which is relevant for the control of the autonomous car.

The detection errors mainly appear in the fusion and, at the same time, do not present in the validation data.

However, when an object can be clearly tracked in the time sequence of the validation data and, at the same time, does not appear (clearly) in the fusion data, then it is most probably a failure of the detection which may be a result of inadequate operation of a component of the control unit.

Accordingly, this latter case can also help in identification of an inadequately operating component of the control unit.

The following parameters are required about these surrounding vehicles (sufficient to track these cars):

Velocity (speed) in m/s
Distance in meters and angle in degrees from the ego (autonomous) car
Lane identifier (id) of the vehicle relative to the ego car
Heading direction, degrees relative to the ego car The following are the optional parameters (it is preferred to have these parameters):

Width and length in meters
Estimated distance from the center of lane in meters
Attachments
Color
Model
Light and turn signal states Most of the above required and optional parameters can be obtained from the recordings made by camera sensors of an autonomous car; an exemplary arrangement of sensors is illustrated in FIG. 1 as introduced above.

For investigation of the surrounding vehicles mostly the cameras on the front of the car, as well as the cameras on the rear part thereof are used. Velocity and distance can be obtained from the recordings of these cameras.

When the autonomous car approaches (follows and gets closer to) a car, it becomes larger and larger in the recordings.

By the stereo camera constituted by camera sensors 12 and 16, the distance of this car can be easily obtained, as well as its velocity relative to the autonomous car can be measured (knowing the actual velocity of the autonomous car, the absolute velocity can be calculated also).

These parameters can be obtained—however, with lower accuracy—from the rear camera sensor 22 about a car approaching the autonomous car from behind.

To get better accuracy, a stereo camera pair can be attached also to the rear part of the autonomous car.

Lane identifier and heading direction can also be obtained mainly from the recordings of camera sensors 12, 16 and 22 (optionally sensor 14) by analyzing the recordings.

Other optional parameters, such as width of a surrounding vehicle, can be obtained from the recordings.

However, for obtaining the length—and attachments, if any—thereof, side camera sensors 24 and 26 can be also used.

The estimated distance of a surrounding vehicle from the center of the lane, as well as its color and model are also information which can be obtained from camera recordings.

By analyzing the recordings (e.g. a certain length of video recording) information on light and turn signal states of surrounding vehicles may also be obtained.

For preparing a scenario it is relevant to define a time period prior to the disengagement event for which the report is processed (the disengagement event corresponds to the time instance when the safety driver needs to take back control from the vehicle); the length of this time period is a relevant parameter.

It is relevant to determine if the disengagement would be avoidable by an earlier maneuver, and, if would, a longer scenario is to be created to seek for options to avoid what has happened (in a longer time period, the autonomous car has more options to choose from), or, if the disengagement is specific to a location or a short sequence of actions, only a short scenario is created.

Fusion data are preferably prepared, before being processed by the scenario generator, by reducing noise to get an idea of what the environment had been before the disengagement happened; this is preferably automatized.

Fusion data can be inaccurate in some cases and this can also be the cause of the disengagement (see second type disengagement above).

Accordingly, in such a case, to recreate the state correctly, a validator sensor is preferably used (if available) to provide additional information that can be used. The data coming from the validator sensor may be utilized in a preferred embodiment according to the following steps:

1. All the vehicles present in the relevant segment of the report are iterated over and processed individually.

The movement of the vehicle between each frame is tested and, if the magnitude of the movement is unnatural, the relevant frame is marked. The position of the vehicle in these marked frames will need to be interpolated between the last and next stable locations.

2. The data available in the validator sensor are matched to the fusion model. All the vehicles are iterated over and tested to what extent the data of the validator sensor and fusion data overlap.

By finding the object detected by the validator sensor which overlaps the most for the whole length of the examined segment, this information can be used to correct the fusion precision and to fill in the locations where interpolation is necessary.

The heading of the vehicles should also be checked here and corrected by the information available in the validator sensor if needed.

The position of the vehicles in the model space generated by the fusion may be discontinuous, while, at the same time, these vehicles can be found also in the model space generated by the help of validation data. In this latter model space the vehicle positions change continuously.

Correspondence is tried to make between these two model spaces in the above step. To this end, overlaps are investigated between the cars in the two model spaces.

Accordingly, information about a vehicle can be preferably considered from both model spaces.

As mentioned above, the validation data take precedence in respect of possible detection errors, and no relevant vehicle is omitted.

3. After identifying a corrected path of the vehicles, appearing and disappearing vehicles should be tested. If a vehicle suddenly disappears and another one appears in its position the assumption that the fusion model is not correct can be made.

If there is information available on the vehicle's appearance like color or model and they match, these two vehicles can be safely merged in the fusion. Otherwise if the validator sensor's data show a continuously moving object, the merge can be performed even without appearance information.

By the help of the validation data, the continuous tracking of vehicles may be achieved also in frames which are marked in step 1 above.

In the following part, an exemplary sequence of steps to generate a scenario are described:

1. Create initial state:
    a) If map data are available based on GPS location, the given road segment is loaded or created.
    b) If no map data are available, the fusion data are processed and lanes and lane connections are created based on the detected road model available in fusion (map creation, loading and generation is not in the scope of this document, these may also be done by known approaches according to point a) or point b)).
    c) Starting positions and speeds (velocities) along all available data of all vehicles are set.
    d) Testing conditions based on safety requirements (e.g. speed change, lane keep, safety gap, etc.) and the reason of the disengagement are set up for the autonomous car. The reason for disengagement is preferably given by the safety driver, why the control was taken back from the autonomous car. This information may help when the inadequately operating component of the control unit is searched for. However, this is only necessary when testing the scenario in the virtual simulator, and can be omitted at the time the log is being processed.

Note to this point d) the following.

The parameter values determined by the safety department (this department is responsible for applying various car safety standards) are needed to be observed by the car in certain circumstances (e.g. a limit cannot be exceeded, or a distance cannot be less than a limit, see below). The above mentioned parameter, speed change means that the target velocity (which is to be maintained) of the autonomous car cannot change more than e.g. 5% if there is no good reason (good reason, i.e. an exception may be that an obstacle is detected on the road, there is a slower car in front of the autonomous car, or it is needed to travel more slowly on a certain road section).

The parameter "lane keep" corresponds to the approaching of the lane markings (how much these can be approached). In an ideal case, when the lane keep functionality is tested, the autonomous car does not get closer to the lane marking more than 10 cm, even in sharp curves.

The parameter "safety gap" corresponds to the distance from the car in front of the autonomous car (it can be characterized also with a time parameter). In general, it is an expectation to follow a car with (at least) 1.5 seconds follow time independent from the velocity of that car, since it can brake any time or it may have an accident.

2. Process the fusion data every "t" seconds (i.e. according to an appropriate time step):

In this step a timestamped log (referred to as scenario log below) is created which can later be fed to the scenario generator.

The log should contain keywords of what actions happened to each vehicle, as well as other changes in the vehicle's behavior that could have changed their movement along their paths.

The following events should be recorded in the log (see also above the required parameters from the surrounding vehicles):

Appear: vehicle id, position, heading, initial speed

Disappear: vehicle id, last known position, heading, speed

Speed: vehicle id, target speed

Lane change: vehicle id, source lane id, target lane id (this represents the exact moment the vehicle has been assigned to a different lane than it was earlier in)

Lane center distance: vehicle id, signed distance in meters from an imaginary center line of the lane Car light state: vehicle id, light name (brake, turn signal left, right, etc.), state of the light (on, off)

The above list of events should be generated in a way that when linear movement of the vehicles is assumed, the positions of the vehicles in the scenario at any given time will match the ones available in the real-time fusion data.

In other words, the scenario has to be built in a way that an equivalent situation is obtained to the one which was created during the travelling of the autonomous car. In short, the scenario has to lead also to a disengagement event in the same way as the real situation happened to the autonomous car.

Once the log is complete it can be forwarded to the scenario generator, which can create a scenario file based on the actual framework.

Although, implementation of the scenario generation and runtime is not in the scope of this document, we can say that the generated log file will be universal in a sense that any kind of scenario testing framework can be prepared to be able to process it and convert it into a valid scenario, meaning it will not restrain usage of known systems, and anyone skilled in the art should be able to prepare a conversion to such frameworks (for example to the open file format openScenario).

Optionally marked are various actions in the autonomous (ego) vehicle's movement which are expected to be executed during the scenario in the same manner, like acceleration, braking, lane change, etc.

These can be tested additionally under the conditions defined by safety but can be evaluated differently.

For example, if the vehicle control software avoids a disengagement by switching lane earlier, or even the opposite, if the car were switching lanes previously and for some reason it no longer does in testing; it might indicate that parts have been changed in the control software which were not intended, given the original lane change was a reasonable move (the main object is to avoid the disengagement after modifying the component of the control unit, and this is reached also in this case: a scenario starting from a certain starting state has been ended in disengagement in a first state of the control unit and the disengagement is avoided in the second improved state thereof).

Although the above description focuses only on vehicles from the surrounding environment, any other participants (e.g. pedestrians, animals, etc.) can be observed and recreated in scenarios using the same method, only by adding new events for the new participants.

Figure 3:
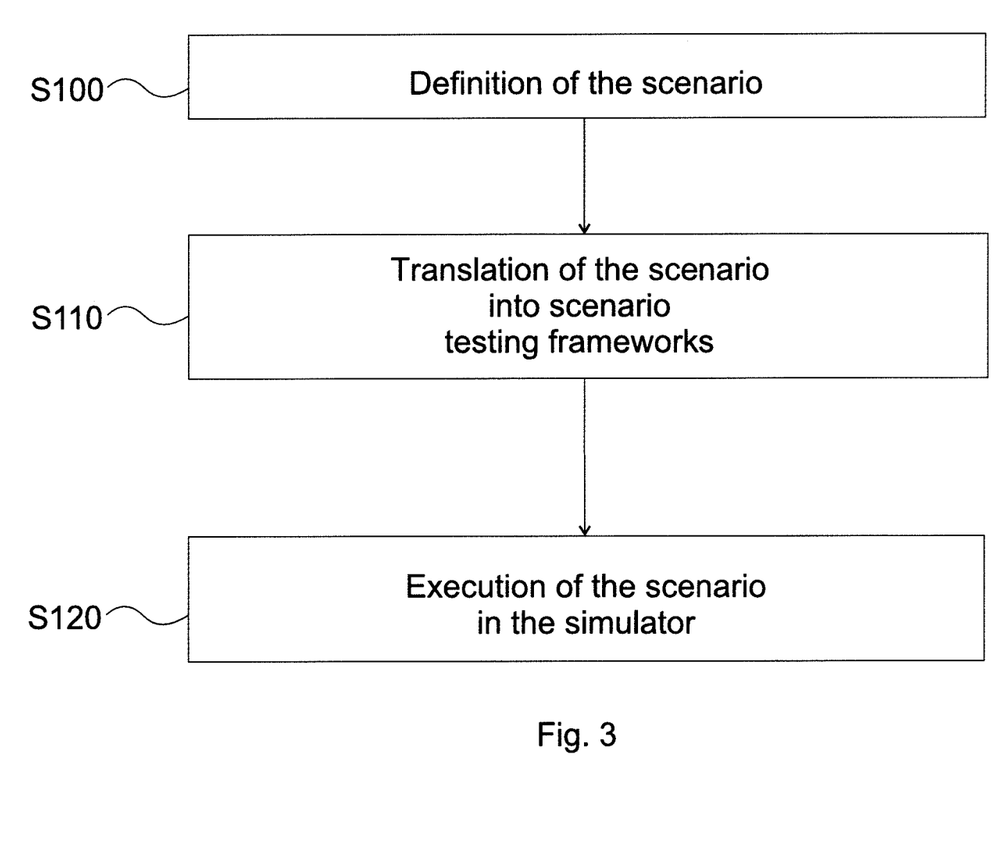
FIG. 3 is a flow diagram of some steps of a further embodiment of the method according to the invention.

In FIG. 3 the workflow of a scenario generation (creation) and evaluation is shown.

In a step S100 the scenario is defined by a safety engineer as follows.

It is defined what road segments the scenario should be running on (how many starting lanes, exit or merge lanes, intersections, curves, etc.), how the vehicles should be positioned on the road segments initially, along with their starting speeds and meta information (vehicle type, color, attachments, etc.).

Next, the different actions to happen are defined in each step of the scenario (speed change, lane change, etc.).

Different conditions to test the vehicle control software against are also defined and the expectations are set along with accepted limits.

In a further step S110, the defined scenario gets translated into a scenario testing framework by creating it in a stand-alone scenario editor.

Starting positions, timers, events and different actions can all be specified there to match the description of the scenario given by the safety engineer.

In a consecutive step S120, the created scenario can then be executed in the virtual simulator.

It will spawn the defined vehicles and waits for the vehicle control software to connect to the simulator (thus, it will be tested by the same control software version which was used in reality, when the disengagement event happened).

Once everything is ready, the scenario starts execution, events and timers are run, etc.

During the scenario, the car driven by the autonomous vehicle software is closely monitored so the defined conditions can be tested (see above point 1d)).

Once one of the conditions reach an active state (meaning that the limits of such condition have been breached) or the vehicle reaches its goal, the simulation stops, and a detailed log file is generated which file can later be analyzed further, played back as a replay or any useful information can be gathered from it.

The tests may preferably be done overnight.

The results of each run are compared to see if the control software performance has increased or decreased in various situations.

Figure 4:
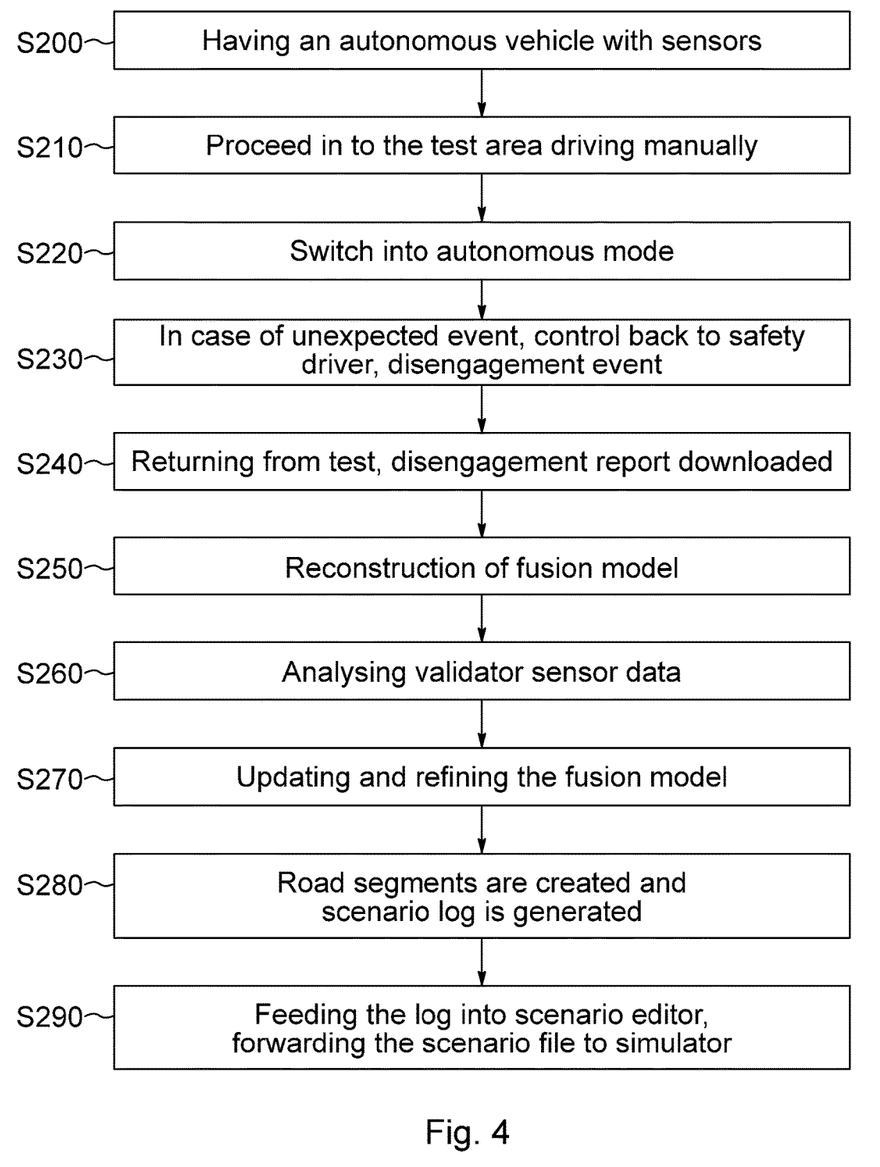
FIG. 4 is a flow diagram of some other steps in a yet further embodiment of the method according to the invention.

In FIG. 4 the workflow of an automatic scenario creation applied in an embodiment of the invention is described.

In a preparatory step S200 (labelled as "having an autonomous vehicle with sensors"), the autonomous vehicle is mounted with cameras and all required sensors for regular road tests.

In case the use of additional—validator—sensors which are not normally used in the fusion (radar or lidar for example) is wanted, these devices are mounted onto the vehicle too.

This step is not to be done for each test but has to be done only once, when the autonomous car is prepared for the tests.

In a next step S210 the autonomous car proceeds to the area where autonomous tests are intended to be performed, it may be driven there manually (it can be also driven there automatically, but in this case the road to the test area is also part of the test).

In a step S220, when the designated test area is reached, the safety driver gives control to the vehicle, switching it to autonomous mode.

The test is performed as planned, but it may be interrupted by an unexpected event, when a disengagement event happens and the control goes back to the safety driver from the autonomous car.

Several test can be done without such an unexpected event, however when it happens, it is captured together with a disengagement report (log).

According to the invention it is advantageous to capture it, since—as it is described throughout this document—the information obtained when a disengagement event happens is used for developing the control of the autonomous car.

Accordingly, in a step S230, when something unexpected happens, either the safety driver interferes and takes back control, or the vehicle control software signals to the driver and gives back control automatically (the disengagement can happen both ways).

At that moment a disengagement report is generated and all the logs and sensor information up to that point is collected and linked in the report for easy access.

In a further step S240, once the road test is terminated and the vehicle returns to the office, the disengagement reports are copied to the office servers, and can be forwarded to the processing software chain, i.e. the disengagement report is downloaded.

In a step S250 first the report is parsed by the framework and a fusion model is reconstructed offline to have a model space for the scenario (using the data of the sensors, the fusion model which was created online during the test, is recreated offline when the disengagement report is post-processed).

Fusion data are only a part of the disengagement related data (i.e. a part of the disengagement report). Several different data are utilized from this data pack (including preferably validation data); in this step these are collected and synchronized to create the model space for the scenario.

Then, in a next step S260, the validator sensor data are analyzed by different software to create a timestamped list of objects along with any relevant meta information.

Accordingly, this type of validator sensor (e.g. a lidar) is adapted for listing surrounding objects. In general, validation data may be any kind of auxiliary information, which can be retrieved offline.

This is an information the utilization of which is not possible online, i.e. in autonomous mode of the autonomous car.

Accordingly, it is not necessary in case of a validator sensor to be able to recognize all of the surrounding objects. On the contrary, the goal is to be able to cover all of the relevant objects by the help of totality of the validation data sources.

After this the steps comprising clearing up fusion (determining which part of it is ambiguous), reducing noise and merging the data from the validator sensor to the available fusion space take place. In summary, these steps can be taken to step S270 labelled as "Updating and refining the fusion model".

Fusion data have been improved in the previous step.

Road segments can now be analyzed, and the necessary parts can be created in a chosen road descriptor format, for example the open-source openDrive and openCRG (step S280).

Also, the scenario log (based on which the scenario is executable) can be now generated for further usage.

In a next step S290, the generated log can be fed to the scenario editor, which can automatically create the scene described in the log and save the scenario file which can immediately be forwarded to the simulator and executed in tests.

In the following different examples with arbitrary (exemplary) chosen parameter values (the parameter values are chosen arbitrarily for every example, when different concrete parameter values are used for illustration) are described to illustrate some aspects of the invention.

First, a simple example is described, which is in connection with an example above where the inaccurate distance estimation was identified by the help of the validator sensor.

Herebelow, new aspects of this example are detailed.

The autonomous car travels behind a green car on the motorway in the outer lane with a velocity of 100 km/h, and the green car has a velocity of 10 km/h lower than the velocity of the autonomous car.

When the autonomous car is only 100 m away from the green car, it recognizes, that an overtaking is needed to have the possibility of holding its current velocity.

It indicates turning, starts to change lanes, however, in the inner lane a red car being currently at a distance of 80 m approaches with a velocity of 130 km/h.

This situation leads to a disengagement, since the approaching car is too close.

The cause of the disengagement is that the car in the inner lane was not detected accurately (it was not observed, or it was observed but estimated to be at a larger distance or to have lower velocity, etc.).

In case of running a scenario created from the camera recordings and logs of the above example, it is expected from the scenario simulation that it will also be realized in the virtual scenario by the simulated autonomous car that an overtaking is to be performed, and then that it will really start overtaking, if the same control software version (same state of the control unit) is applied in the simulator as in the real test.

In other words, the scenario has to be built in such a good quality that it will also lead to disengagement if the control software has not been changed since the test leading to the disengagement event.

Assume that this is realized in the simulator, accordingly, the car behaves the same way as during the test.

After this, the root of the failure of the control unit can be searched for (the disengagement was the consequence of this failure).

In the above example, overtaking was allowed in the controlling unit of the autonomous car, since the distance estimating algorithm estimated that the approaching car is at a distance of 130 m, but in reality, it was at 80 m.

After finding the root of the failure, the distance estimating algorithm has been modified (developed), and now it gives an estimation within failure limit (e.g. it estimates that the approaching car is at 83 m distance).

Thus, it is realized in the control unit that an overtaking should be performed, but the overtaking is not allowed to be started in the control unit version using the modified distance estimating algorithm.

Thus, the disengagement will be avoided.

If modules in correspondence with the overtaking logic have also been modified (developed) in the meantime, it can happen that the control software decides not to overtake a vehicle being in front of the autonomous car at a distance of 100 m and having a velocity lower by 10 km/h.

Thus, the distance estimation failure at the lane change does not occur. As a consequence, the speed of the autonomous car is lowered, but nothing else is done. This is interpreted as a failing behavior. Thus, this is also a valuable result from the scenario made on the basis of the disengagement event, since—if it is a safety expectation that the autonomous car should not go closer than 100 m to a car having a velocity of 10 km/h lower—this can also be fixed in the virtual environment to somehow avoid the situation that no overtaking is made but the autonomous car simply follows another car with decreased speed.

This is an example for motorways where the overtaking can be made by a simple lane change.

The quality of the asphalt can be a relevant factor in case of a disengagement which is caused by lane keeping problems.

In an exemplary test route, a short, only a couple of meters long part is revealed where the road has been reconstructed with fresh asphalt, thus the (painted) lane separating markings cannot be detected easily (in many cases a new asphalt is darker than an average road segment; thus, the detection may observe it rather as a shadow not as a road surface), and thus the autonomous car frequently drifts into the other lane.

This is an event which the developers do not expect to cause a problem, but, based on the test and the disengagements happen during the test (in the present example, the unwanted lane change causes a disengagement), it is clear that the control software has to be prepared for such a case. In this case, if the environment were modelled by hand for the simulator, the accurate model of the above mentioned road segment would be prepared by a dedicated graphical designer, and it is conceivable that the reconstruction of every details of the road would not be accurate enough (e.g. the graphical designer most probably would not assume that the quality of the asphalt is relevant, and would not put emphasis on the details corresponding to this), and, thus, the failure would not occur in the simulator.

It is thus an expectation from a scenario generated based on a disengagement, that the car should behave in the same manner as during the test and fail by the running of the scenario like in the real test if the applied control software version is the same. If this does not happen, the reproduction of the scenario is to be developed further to such an accuracy.

When the precision of the scenario does not reach an acceptable limit, it can be the result of various causes (the movement of certain cars is not precise enough, various light circumstances, various weather conditions, different qualities of the lane markings, etc.).

In view of the concrete cause, the appropriate tools or methods for improving the precision of the scenario.

Further exemplary situations which may lead to disengagement are described herebelow.

It may happen that a car in the other direction lane is taken by the sensor fusion into the lane of the autonomous car.

The problem is to be searched for and fixed in the algorithm responsible for ordering lanes to the cars.

If in the history the erroneously positioned car always changed its lane or if there is also an algorithm available which gives a slower but more precise ordering of the lanes, then the cause of this disengagement can be reproduced by the basic sensors, if not, it is necessary to use a validator sensor.

In a subsequent example, a smaller car is following a lorry, and suddenly starts to overtake it.

These two vehicles travel in front of the autonomous car in the same direction. In the beginning the lorry, the small car and the autonomous car are in the same (outer) lane.

The small car changes to the inner lane from this lane to overtake the lorry, and thus the autonomous car will travel directly behind the lorry.

The lorry is precisely recognized by the sensor of the autonomous car, but it suddenly detects a much larger object in place of the small car (when the overtaking starts), from which the autonomous car deduces that the small car is approaching at a fast pace.

This problem may be resolved by appropriate tracking (by so-called instance tracking) of the detected vehicles. If the small car is accurately detected in the neighboring lane next to the lorry, then the situation can be reproduced by the basic sensors.

The instance tracking is made by the fusion. In nutshell, during the instance tracking all of the vehicles have a number, and the vehicles are tracked by the help of these number as long as they are "visible" (detectable) for the autonomous car.

However, if detection of the small car fails when it starts to overtake the lorry, and there is no detection algorithm which recognizes it (even in offline running), then this problem can only be resolved by the help of a validator sensor.

In a further example, a car (to be detected by the autonomous car for the control thereof) is running on the motorway in sunny weather and gets under an overpass. Because of the sudden dark environment, the detection is lost at this moment.

Thus, it will be detected suddenly when it comes out of the darkness (the car comes from "nowhere" which can be interpreted by the control as fast approaching) and the autonomous car starts to brake at the same time which may lead to disengagement.

This situation will most probably be reproducible by the help of basic sensors.

In the course of overtaking a long, multiple-car lorry (truck trailer) it may sometimes happen that the extremely long object is detected by the appropriate algorithm as separate cars (lorries).

To reproduce this situation using data of the basic sensors is also enough, since the problem is caused by the fact that an object (lorry) can be "seen" by the sensors for too long.

In strong sunshine, when the Sun is close to the horizon, it may happen that the lanes cannot be detected because of the large luminance of the surface of the road. This is a special situation, it most probably cannot be resolved in lack of a validator sensor, since the camera recordings do not comprise real information about the lane markings.

However, if a lidar is used as a validator sensor, the position of the Sun does not matter and the lane markings can be preferably detected (because of their slight protrusion from the road surface).

Thus, although the camera recordings do not give useful information of the lane markings, the virtual testing of the scenario is possible, since lidar as a validator sensor helps to reconstruct the lane markings.

In an example the autonomous car is travelling in a strong side wind.

After an overtaking a larger lorry, the autonomous car may be suddenly hit from the side by the wind, and tilts the car a little bit stronger.

If the applied detecting algorithms are sensitive this may deteriorate their results, and it is conceivable e.g. that the lane markings will not be appropriately represented in the road model (the road model become tilted, thus, it does not fit the camera detections, which may cause disturbance in planning of the trajectory and, therefore, may lead to disengagement).

This case can be reproduced by the basic sensors; if e.g. an IMU (inertial measurement unit) sensor is applied as a basic sensor in the car, it can be detected that the road holding of the car was not appropriate (like under normal conditions), but it was travelling a little bit tilted.

This information may be utilized runtime for automatic software-based correction, but such cases are also conceivable where the algorithm (component of the control unit), being responsible for the correction of this effect, does not operate appropriately.

If it is experienced that the case cannot be reproduced even utilizing the data measured by the IMU sensor, then appropriate reproduction can be expected only when a validator sensor is utilized (e.g. a lidar based on the data of which tilting can be detected).

As mentioned above, an IMU sensor is not necessarily applied as one of the basic sensors.

A control software initialized disengagement occurs, when the control software gets into an indefinite state as mentioned above.

This can be caused by any hardware failure (e.g. a critical camera stops), but it can also be a consequence of the environment (e.g. lane markings or road surface cannot be detected in front of the autonomous car, thus it cannot calculate a trajectory).

Naturally, a hardware failure needs fixing of that hardware, but other causes (disturbed camera recording, GPS signal or camera signal) may be fixed by the help of modifying (developing) a component of the control unit.

Several different failures can be preferable handled by the control of the autonomous car.

As long as the autonomous car can travel safely, it will go even with e.g. stopped cameras.

However, when it cannot travel safely any more, it gives a signal to the driver and gives back control.

In many cases it is the other participants of the traffic that cause the disengagement (e.g. the position of some of them is erroneously detected), but in other cases a problematic situation can originate from the environment independently of the other participants of the traffic.

Thus, the framework used for the method according to the invention has to be generated (built) in a way that it will be able to record all considerable details, as well as to reproduce this virtually.

These considerable details of the environment can be classified into multiple groups. Dynamic objects may be vehicles, pedestrians, or animals.

Static objects (fixed in place) may be e.g. traffic lights, traffic signs.

The location and position of these latter will not change most probably, thus we can rely also on map data, which have to be combined with the objects that can be found in the recordings, so these are easier to handle.

Weather, position of the Sun, or shadows may be considered as dynamic environmental parameters (factors), while the position of buildings and bridges or variations in the road surface and deficiencies in the lane markings may be considered as static environmental parameters.

For each of these four larger groups (dynamic and static objects, dynamic and static environmental parameters) a separate algorithm is needed which detects the given characteristic or specific detail in the recordings, and, via the log generated in connection with the disengagement, it is displayed in the simulator.

The invention relates also to a system for modifying a control unit of an autonomous car, wherein the modifying of the control unit is performed by an embodiment of the method according to the invention.

The system may be electronically connected to a control unit of an autonomous car to perform modifications thereon.

The invention, furthermore, relates to a computer program product comprising instructions which, when the program is executed by a computer, cause the computer to carry out an embodiment of the method according to the invention.

The computer program product may be executable by one or more computers.

The invention also relates to a computer readable medium comprising instructions which, when executed by a computer, cause the computer to carry out an embodiment of the method according to the invention.

The computer readable medium may be a single one or comprise more separate pieces.

The invention is, of course, not limited to the preferred embodiments described in details above, but further variants, modifications and developments are possible within the scope of protection determined by the claims.

Furthermore, all embodiments that can be defined by any arbitrary dependent claim combination belong to the invention.

The invention claimed is:

1. A method for modifying a control unit of an autonomous car, the autonomous car being equipped with basic sensors adapted for recording sensor data based on which a fusion model of objects and an environment surrounding the autonomous car can be generated, wherein the sensor data recorded by the basic sensors enables the control unit to control the autonomous car in autonomous driving mode, the method comprising:

while the control unit is in a first state, recording the sensor data by the basic sensors during an autonomous test action performed in autonomous driving mode of the autonomous car, in response to being triggered by a disengagement event, logging disengagement related data comprising the sensor data recorded by the basic sensors in an analysis time window before the disengagement event, generating a virtual scenario in a simulator apparatus for the analysis time window based on the disengagement related data, wherein the virtual scenario comprises a virtual counterpart of the autonomous car having virtual counterparts of the basic sensors, and performing a first virtual autonomous run according to the autonomous test action with the virtual counterpart of the autonomous car using the first state of the control unit in the simulator apparatus, so that the first virtual autonomous run leads to the disengagement event in the virtual scenario, identifying based on the virtual scenario an inadequately operating component of the control unit, wherein the disengagement event has been caused by inadequate operation of the inadequately operating component of the control unit, and generating a second state of the control unit based on the first state of the control unit by modifying the inadequately operating component of the control unit, performing a second virtual autonomous run according to the autonomous test action with the virtual counterpart of the autonomous car using the second state of the control unit in the simulator apparatus, checking whether the disengagement event is avoided in the second virtual autonomous run, and storing the modified component of the control unit if the disengagement event is avoided in the second virtual autonomous run.

2. The method according to claim 1, further comprising applying validation data in generating the virtual scenario for validating a validation scenario part of the virtual scenario based on comparing a validation model of the validation scenario part to the fusion model of the validation scenario part for at least a part of the analysis time window, and the inadequately operating component of the control unit is identified by means of the comparison of the validation model of the validation scenario part and the fusion model of the validation scenario part for at least the part of the analysis time window.

3. The method according to claim 2, characterized in that the autonomous car is equipped with a validator sensor adapted for recording the validation data.

4. The method according to claim 3, characterized in that the validator sensor is different from the basic sensors.

5. The method according to claim 4, characterized in that the validator sensor is a lidar device.

6. The method according to claim 5, characterized in that a distance estimation component of the control unit is identified as the inadequately operating component of the control unit, and the distance estimation component of the control unit is modified for generating the second state of the control unit based on the first state of the control unit.

7. The method according to claim 1, characterized in that, if the fusion model generated by means of the basic sensors in the analysis time window is found to be acceptable in the analysis time window, after performing the second virtual autonomous run, a third virtual autonomous run is performed according to the autonomous test action with the virtual counterpart of the autonomous car giving the disengagement related data to virtual counterparts of the basic sensors of the virtual counterpart of the autonomous car using the second state of the control unit in the simulator apparatus.

8. A system for modifying a control unit of an autonomous car, the system comprising a computer connected to the control unit and including instructions that, when executed by the computer, cause the computer to:
  while the control unit is in a first state, record sensor data from basic sensors of the autonomous car during an autonomous test action performed in autonomous driving mode of the autonomous car,
  in response to being triggered by a disengagement event, log disengagement related data comprising the sensor data recorded in an analysis time window before the disengagement event,
  generate a virtual scenario in a simulator apparatus for the analysis time window based on the disengagement related data, wherein the virtual scenario comprises a virtual counterpart of the autonomous car having virtual counterparts of the basic sensors, and perform a first virtual autonomous run according to the autonomous test action with the virtual counterpart of the autonomous car using the first state of the control unit in the simulator apparatus, so that a first virtual autonomous run leads to the disengagement event in the virtual scenario,
  identify, based on the virtual scenario, an inadequately operating component of the control unit, wherein the disengagement event has been caused by inadequate operation of the inadequately operating component of the control unit, and
  generate a second state of the control unit based on the first state of the control unit by modifying the inadequately operating component of the control unit, perform a second virtual autonomous run according to the autonomous test action with the virtual counterpart of the autonomous car using the second state of the control unit in the simulator apparatus, check whether the disengagement event is avoided in the second virtual autonomous run, and store the modified component of the control unit if the disengagement event is avoided in the second virtual autonomous run.

9. A computer program product comprising a non-transitory computer readable medium storing instructions which, when executed by a computer, cause the computer to:
  while the control unit is in a first state, record sensor data from basic sensors of the autonomous car during an autonomous test action performed in autonomous driving mode of the autonomous car,
  in response to being triggered by a disengagement event, log disengagement related data comprising the sensor data recorded in an analysis time window before the disengagement event,
  generate a virtual scenario in a simulator apparatus for the analysis time window based on the disengagement related data, wherein the virtual scenario comprises a virtual counterpart of the autonomous car having virtual counterparts of the basic sensors, and perform a first virtual autonomous run according to the autonomous test action with the virtual counterpart of the autonomous car using the first state of the control unit in the simulator apparatus, so that a first virtual autonomous run leads to the disengagement event in the virtual scenario,
  identify, based on the virtual scenario, an inadequately operating component of the control unit, wherein the disengagement event has been caused by inadequate operation of the inadequately operating component of the control unit, and
  generate a second state of the control unit based on the first state of the control unit by modifying the inadequately operating component of the control unit, perform a second virtual autonomous run according to the autonomous test action with the virtual counterpart of the autonomous car using the second state of the control unit in the simulator apparatus, check whether the disengagement event is avoided in the second virtual autonomous run, and store the modified component of the control unit if the disengagement event is avoided in the second virtual autonomous run.

\* \* \* \* \*